(12) United States Patent
Fujimoto et al.

(10) Patent No.: US 7,070,907 B2
(45) Date of Patent: Jul. 4, 2006

(54) SUBSTRATE HAVING CHARACTER/SYMBOL SECTION AND PROCESSING METHOD OF CHARACTER/SYMBOL SECTION

(75) Inventors: Shigekazu Fujimoto, Tokyo-to (JP); Masaaki Kurihara, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 11 days.

(21) Appl. No.: 10/235,737

(22) Filed: Sep. 5, 2002

(65) Prior Publication Data

US 2003/0044730 A1    Mar. 6, 2003

(30) Foreign Application Priority Data

Sep. 6, 2001    (JP)    ............................ P2001-269820

(51) Int. Cl.
 *G03C 5/00*    (2006.01)
(52) U.S. Cl. ...................... 430/311; 430/313; 430/317; 430/5
(58) Field of Classification Search ................ 430/5, 430/311, 313; 385/124, 123
See application file for complete search history.

(56) References Cited

U.S. PATENT DOCUMENTS

| | | | |
|---|---|---|---|
| 4,425,769 A | 1/1984 | Hakoune | |
| 5,446,421 A | 8/1995 | Kechkaylo | |
| 5,446,521 A | 8/1995 | Hainsey et al. | |
| 5,477,058 A | 12/1995 | Sato | |
| 5,786,114 A * | 7/1998 | Hashimoto | 430/5 |
| 5,786,116 A | 7/1998 | Rolfson | |
| 6,200,711 B1 | 3/2001 | Kurihara et al. | |
| 6,214,495 B1 * | 4/2001 | Segawa et al. | 430/5 |

FOREIGN PATENT DOCUMENTS

| | | |
|---|---|---|
| EP | 0895235 | 2/1999 |
| EP | 0965884 | 12/1999 |
| JP | 8 48597 | 2/1996 |
| JP | 2001 100392 | 4/2001 |

* cited by examiner

*Primary Examiner*—John A. McPherson
*Assistant Examiner*—Daborah Chacko-Davis
(74) *Attorney, Agent, or Firm*—Ladas & Parry LLP

(57) ABSTRACT

The present invention provides a substrate-engraving-type chromeless phase-shift mask enabling to adopt a manufacturing method which poses no problem in quality, gives a high operating efficiency, and permits arrangement of characters and symbols, and a manufacturing method thereof. The substrate of the invention has a character/symbol section, on a surface of a transparent substrate, comprising characters and/or symbols engraved in the form of a slit-shaped or lattice-shaped pattern comprising concave grooves only in a prescribed portion corresponding to the characters and/or symbols.

2 Claims, 3 Drawing Sheets

(a)

(b)

(c) (c1) (d) (d1)

SUBSTRATE HAVING CHARACTER/SYMBOL SECTION AND PROCESSING METHOD OF CHARACTER/SYMBOL SECTION

BACKGROUND OF THE INVENTION

1. Field of the Invention

The present invention relates to a transparent substrate, used in a phase-shift mask for manufacturing semiconductor, a mask for processing optical products, or other optical products, having a character/symbol section in which a slit-shaped or lattice-shaped pattern comprising concave grooves is provided on one surface of the substrate only in a prescribed area in response to the shapes of the characters and/or the symbols, and a manufacturing method thereof.

2. Description of the Related Art

There is recently an increasing demand for a higher density and a finer configuration of semiconductor chip circuits. It is therefore necessary to transfer a finer circuit pattern onto a resist on a wafer. From such a point of view, the conventional binary mask forming a circuit pattern with a light shielding section and a transparent section is insufficient to satisfy requirements.

More recently, on the other hand, progress in optical lithographic technology is really remarkable, and as a technique for improving resolution of the projecting exposure unit, it is the present common practice to adopt the phase-shift process which increases the pattern resolution by using different phases of light passing through two adjacent transparent portions on the photomask.

Various types of phase-shift mask used in this phase-shift process have been developed, and are used in response to the purposes of use. Among others, the engraving type phase-shift mask of forming a shifter section by engraving the substrate is becoming more common.

A substrate-engraving-type chromeless phase-shift mask for processing optical products is now applied for processing optical fibers.

Because a layer of a chromium-based metal such as chromium, chromium oxide or chromium oxide nitride is usually used as a light shielding layer for various phase-shift masks, a phase-shift mask which does not have a light shielding layer but uses a shifter section comprising concave grooves formed on a surface of a transparent substrate is referred to as a chromeless phase-shift mask of the substrate-engraving type.

In the above-mentioned photomask, it is required to provide characters or symbols. It therefore becomes necessary to conduct operations for forming characters and symbols on the mask, together with preparation of a circuit pattern on the mask portion, thus requiring more and more complicated manufacture of the mask as a whole.

It is demanded, not to perform formation of characters and symbols as an independent and separate step, but to form characters and symbols within a photomask preparing step as far as possible. In the conventional manufacturing process of a substrate-engraving-type chromeless phase-shift mask, the problems shown in FIG. 3 are encountered.

FIG. 3(a) is a schematic plan view of the middle of processing of a conventional substrate-engraving-type chromeless phase-shift mask having characters and symbols; FIG. 3(b) is a schematic view illustrating enlarged characters in B1 portion of FIG. 3(a); FIG. 3(c) is an enlarged view of B2 portion shown in FIG. 3(b); FIG. 3(d) is a sectional view of FIG. 3(c) cut along the line B3-B4; and FIGS. 3(c1) and 3(d1) illustrate states after processing corresponding to FIGS. 3(c) and 3(d), respectively. In FIG. 3, reference numeral 200 represents a phase-shift mask; 210 represents a transparent substrate; 220 represents a main pattern section; 230 represents a character/symbol section; 231 represents a light shielding film; 232 represents an opening (of the light shielding film); and 215 represents a concave groove section.

Character "2" in the B1 portion of the character/symbol section 230 shown in FIG. 3(a) is formed by opening the light shielding film 231, as shown in FIG. 3(b). An enlarged schematic plan view of B2 portion thereof is as shown in FIG. 3(c). The sectional view of FIG. 3(c) cut along the line B3–B4 is as shown in FIG. 3(d).

The conventional manufacture of a substrate of a substrate-engraving-type chromeless phase-shift mask is accomplished simultaneously with the forming step of a circuit pattern which is the main pattern for the formation of a character/symbol section, resulting in the manner shown above.

However, this manufacturing method of the substrate-engraving-type chromeless phase-shift mask contains a step of wet-etching all or part of the light shielding film, following the forming step of characters and symbols, and patterned characters in this step sometimes disappear as shown in FIGS. 3(c1) and 3(d1).

A counter-measure was taken to prevent disappearance of patterned characters and symbols by a method comprising the steps of covering the characters and symbols with a wet-etching-resistant protective film and carrying out wet etching. In this case, however, problems were encountered in that excessive light shielding film remained near the characters, and the addition of a coating step of the protective film led to a lower operating efficiency.

The present invention was developed to solve the problems as described above, and has an object to provide a substrate-engraving-type chromeless phase-shift mask which poses no problem in quality, gives a high operating efficiency, and permits arrangement of characters and symbols, and a manufacturing method thereof.

SUMMARY OF THE INVENTION

The present invention provides a substrate having a character/symbol section, on a surface of a transparent substrate, comprising character and/or symbols engraved in the form of a pattern of concave grooves only in prescribed areas meeting the shapes of the characters and/or symbols.

In the substrate mentioned above, the transparent substrate is a glass substrate or a resin substrate.

Also in the above-mentioned substrate, the pattern comprising concave grooves is a slit-shaped or lattice-shaped pattern, and the slit-shaped or lattice-shaped pattern is formed so that the width of a concave groove and the width of the space between two adjacent concave grooves are at a ratio 1:1.

In the above-mentioned substrate, the character/symbol section is an alignment mark, an area code, a barcode, a scale or a position mark indicating a location.

Again in the substrate described above, the substrate having the character/symbol section is a photomask, and the photomask includes a substrate-engraving type chromeless phase-shift mask or a phase masks for fiber Bragg grating fabrication as disclosed in Japanese Patent Publication No. H7-140311.

The processing method of the character/symbol section in the substrate having the character/symbol section comprises (a) resist arranging step of arranging an electron-beamsensitive resist on a light shielding film provided at least in a character/symbol section forming area of a surface of a transparent substrate; (b) a resist image forming step of forming a resist image opening at portions for forming a pattern comprising concave grooves by developing the resist after selective exposure of the resist by means of an exposing unit such as an electron beam exposing unit; (c) an etching step of forming a light shielding film opening at portions for forming the pattern comprising the concave grooves by etching the light shielding film exposed from the openings of the resist image; (d) a substrate engraving step of engraving the resist and transparent portions of the substrate exposed from the openings of the light shielding film; and (e) a removing step of removing resist and light shielding film.

In the above-mentioned method, the substrate having the character/symbol section is a chromeless phase-shift mask having no substrate-engraving-type light shielding layer, and the resist arranging step is conducted by simultaneously carrying out, after providing a light shielding film over an entire surface of the transparent substrate and arranging an electron-beam-sensitive resist over the entire surface of the light shielding film, a step for forming the character/symbol section and a step for forming the shifter section, comprising (A) a resist image forming sub-step of selectively exposing the resist to electron beam, and developing the resist, thereby forming a resist image opening at portions for forming the character/symbol section and a portion for forming a shifter section; (B) an etching sub-step of etching the light shielding film opening at portions for forming the character/symbol section and a portion for forming the shifter section; (C) a substrate engraving sub-step of engraving the portions of the substrate exposed from openings of the resist and the light shielding film by etching; and (D) a sub-step of removing remaining resist and light shielding film.

Also in the method described above, the pattern comprising concave grooves is a slit-shaped or lattice-shaped pattern.

The method as described above can be applied also in the manufacture of a phase masks for fiber Bragg grating fabrication.

Manufacturing methods when the transparent substrate is made of a resin include a method comprising the steps of using a glass substrate prepared as above as an original board, making a matrix with reversed convexity-concavity, and preparing a resin product with positive convexity-concavity from the matrix.

By adopting the configuration as described above, the transparent substrate of the present invention makes it possible to provide a substrate having a character/symbol section permitting recognition of characters and symbols by only forming concave grooves on the transparent substrate.

Particularly, the invention enables to provide a substrate-engraving-type chromeless phase-shift mask which permits use of a manufacturing method which poses no problem in quality, gives a high operating efficiency, and permits arrangement of characters and symbols, having a character/symbol section.

More specifically, the aforementioned object is achieved by a substrate having a character/symbol section, on a surface of a transparent substrate, comprising characters and/or symbols engraved in the form of a pattern of concave grooves only in prescribed areas meeting the shapes of the characters, and/or symbols.

Specifically, identification of characters and symbols by reflected light is made possible by providing a pattern comprising concave grooves only in prescribed areas in response to shapes of characters and/or symbols.

By preparing the character/symbol section in a mirror image pattern, it is possible to confirm the character/symbol section even from the back.

Use of a slit-shaped or lattice-shaped pattern comprising concave grooves permits achievement of a simpler and more practical pattern.

A ratio 1:1 of the groove width to the width of the space between grooves of the slit-shaped or lattice shaped pattern comprising the concave grooves is preferable in terms of visibility.

The pitch of the groove width and the space between grooves should preferably be within a range of 0.2 to 10 µm.

The character/symbol section may be an alignment mark necessary when drawing a photomask or a wafer, an area code, a barcode, a scale or a position mark indicating a location. It suffices to provide the same in response to the purpose of use.

The characters may be alphabet, numerals, Hiragana, Katakana or any other kind of character.

A photomask may be used as a substrate having a character/symbol section as described above, and particularly, a substrate-engraving-type phase-shift photomask is effective as described above.

When the substrate having a character/symbol section is a semiconductor manufacturing mask, it is applicable for confirming the type of the mask and other pieces of information upon attaching the mask to a drawing unit.

The processing method of a character/symbol section in a substrate having the character/symbol section of the invention makes it possible to provide a manufacturing method of a photomask, which poses no problem in quality, gives a high operating efficiency, and permits arrangement of characters and symbols.

When manufacturing an engraving-type chromeless phase-shift mask, a character/symbol section is formed flush with the photomask circuit pattern. It is therefore possible to obtain a character/symbol section as shown in FIG. 3(b), which has conventionally required two runs of makeup, by a single run of makeup, because a circuit pattern and the character/symbol section can be prepared simultaneously in a step.

It is thus possible to manufacture a mask having a character/symbol section permitting identification by reflected light to the substrate without the necessity to leave a light shielding film near the character/symbol section.

BRIEF DESCRIPTION OF THE DRAWINGS

FIG. 3(a) is a schematic plan view of a conventional substrate-engraving-type phase-shift mask having characters and symbols during processing; FIG. 3(b) is a schematic view illustrating enlarged characters in B1 portion shown in FIG. 3(a); FIG. 3(c) is an enlarged view of B2 portion shown in FIG. 3(b); FIG. 2(d) is a sectional view of FIG. 3(c) cut along the line B3–B4.

DESCRIPTION OF THE PREFERRED EMBODIMENTS

An embodiment of the present invention will now be described with reference to the drawings.

Figure 1:
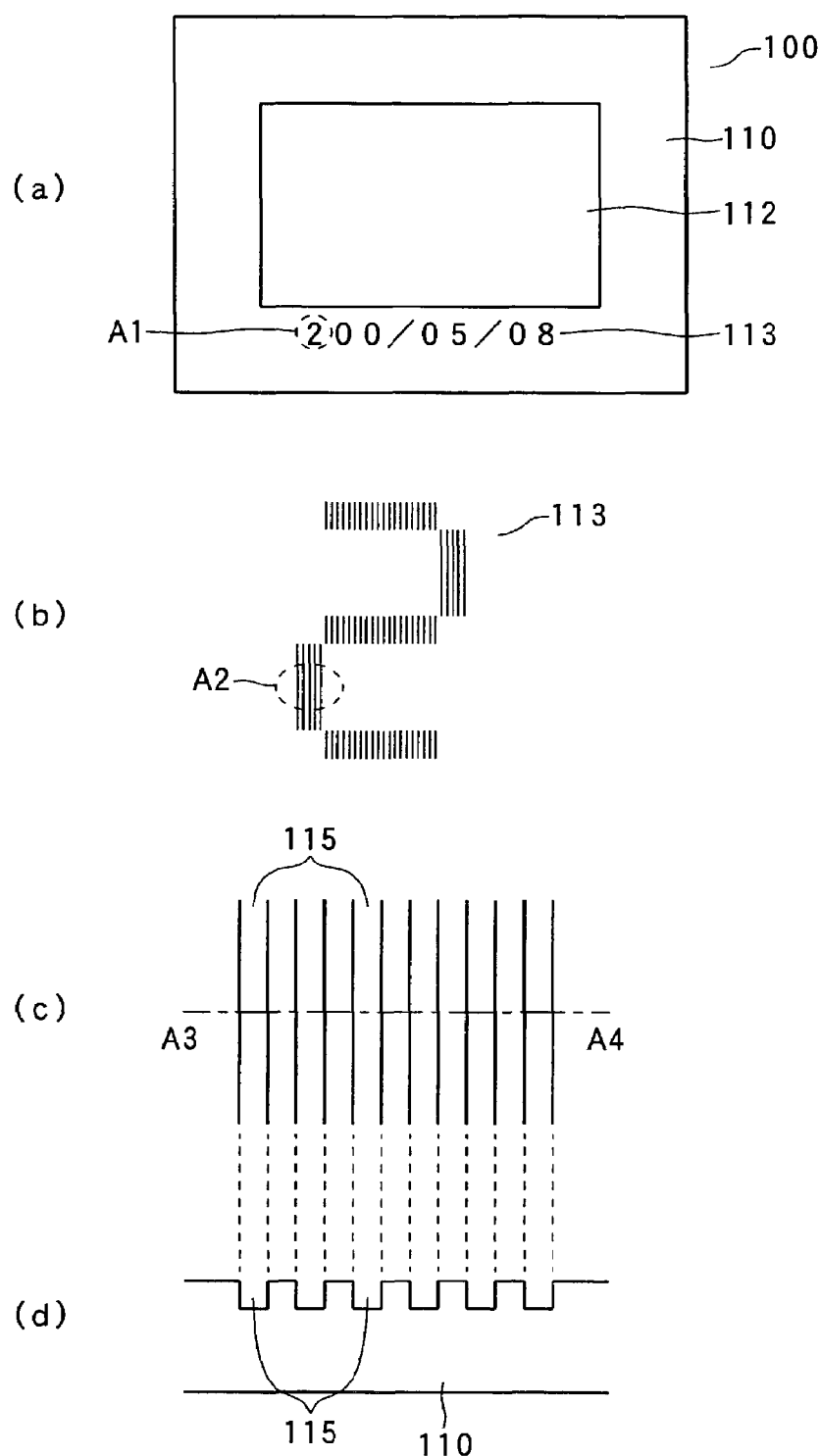
FIG. 1(a) is a schematic plan view of a phase-shift mask which is an embodiment of the substrate having a character/symbol section of the present invention.
FIG. 1(b) is a schematic view illustrating enlarged characters in A1 portion shown in FIG. 1(a)
FIG. 1(c) is an enlarged view of A2 portion of FIG. 1(b)
FIG. 1(d) is a sectional view of FIG. 1(c) cut along the line A3–A4.

FIG. 1(a) is a schematic plan view of a phase-shift mask which is an embodiment of the substrate having a character/symbol section of the present invention; FIG. 1(b) is a schematic view illustrating enlarged characters and A1 portion shown in FIG. 1(a); FIG. 1(c) is an enlarged view of A2 portion of FIG. 1(b); and FIG. 1(d) is a sectional view of FIG. 1(c) cut along the line A3–A4; and FIG. 2 is a processing step diagram of the character/symbol section shown in FIG. 1.

Figure 2:
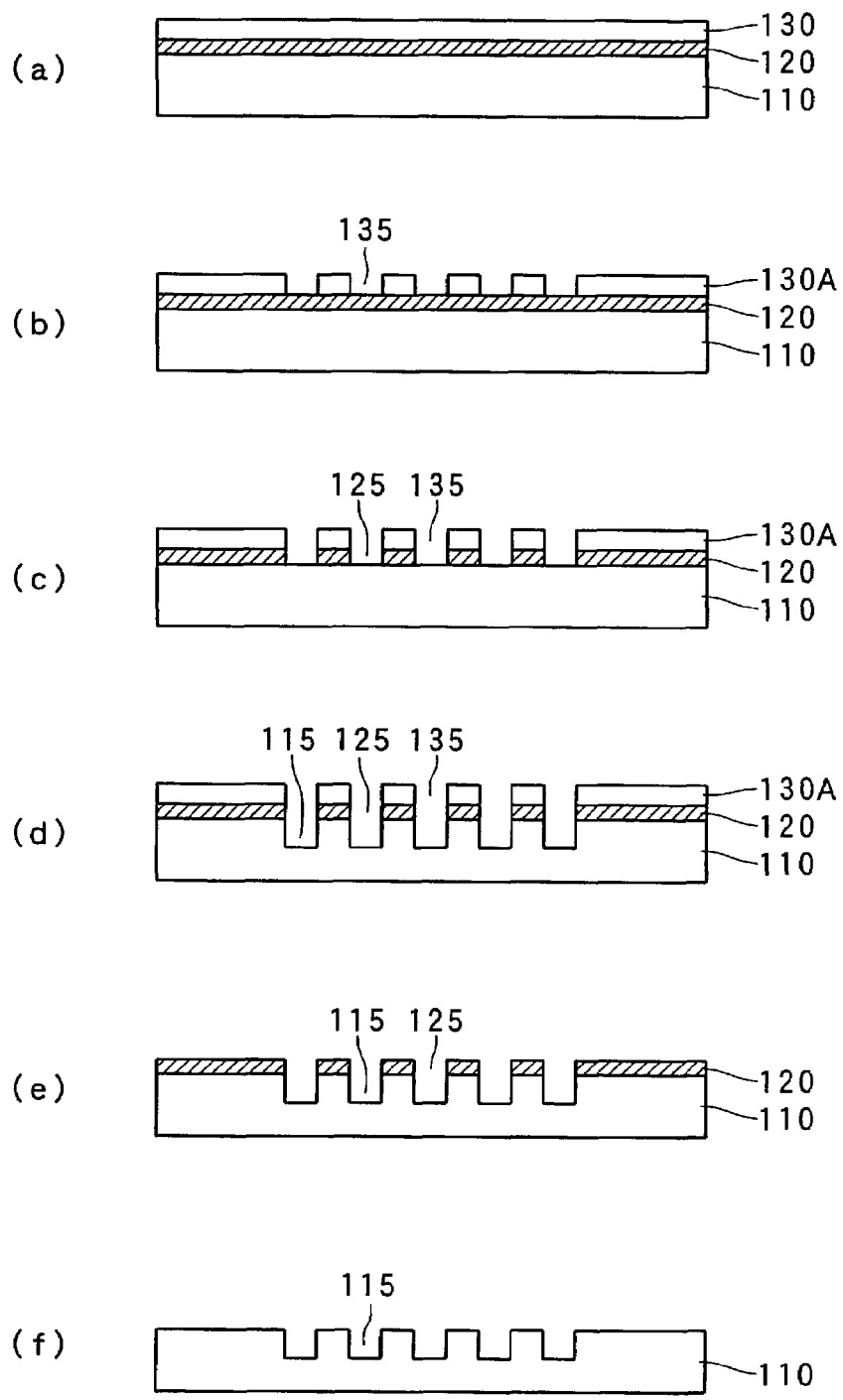
FIG. 2 is a processing step diagram of the character/symbol section shown in FIG. 1.
Figure 3:
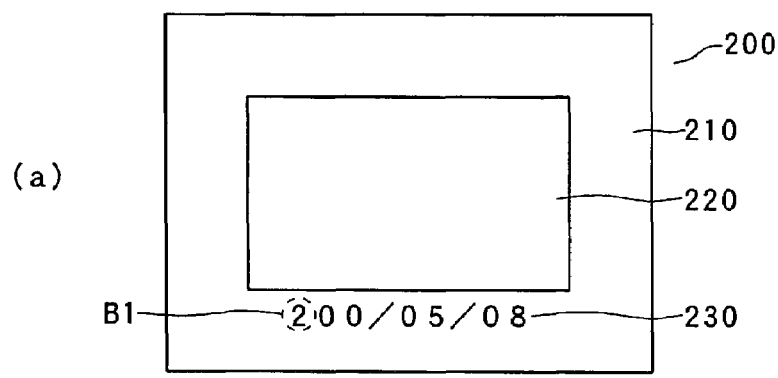
FIGS. 3(c1) and 3(d1) illustrate states after processing corresponding to FIGS. 3(c) and 3(d).
Figure 3:
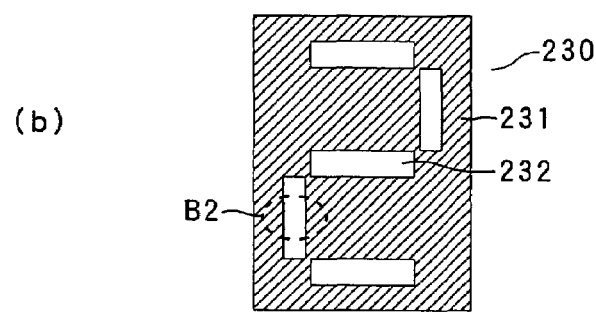
Figure 3:
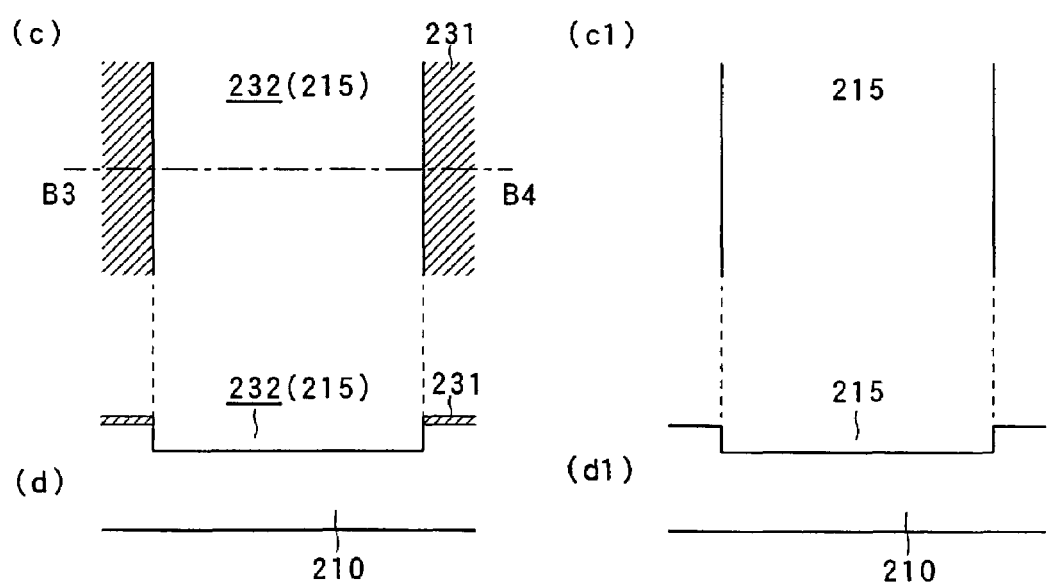

In FIGS. 1 and 2, 100 represents a substrate having a character/symbol section (also referred to as a phase-shift mask or simply as a substrate); 110 represents a transparent glass substrate; 112 represents a circuit pattern portion; 113 represents a character/symbol section; 115 represents concave grooves; 120 represents a light shielding film; 125 represents an opening (of the light shielding film); 130 represents a resist layer; 130A represents a resist image; and 135 represents an opening of the resist layer.

An embodiment of the substrate having a character/symbol section of the present invention will be described with reference to FIG. 1.

The substrate 100 having the character/symbol section of the embodiment shown in FIG. 1(a) is a substrate-engraving-type chromeless phase-shift mask having the character-symbol section 113 arranged in an area different from that of the circuit pattern 112. The character/symbol section 113 has a slit-shaped pattern comprising concave grooves 115 engraved on the transparent glass substrate 110, as shown in FIGS., 1(c) and 1(d), provided in only a prescribed area in response to the shapes of the characters and/or symbols.

The pattern of slits comprising the concave grooves 115 has a ratio 1:1 of the groove width to the width of a space between grooves.

The pitch of the concave groove width and the space between the concave grooves 115, of which the minimum manufacturable size is about 0.2 μm, should preferably be 10 μm or smaller from the point of view of visibility.

A variation of this embodiment is one formed with a pattern having concave grooves 115 of the character/symbol section 113 of a lattice shape, not a slit shape.

In another variation of this embodiment, an alignment mark, an area code, a barcode, a scale or a position mark indicating a location is provided in the character/symbol section in response to the purpose of use.

An example of processing of the character/symbol section in the substrate having the character/symbol section of this embodiment will now be briefly described with reference to FIG. 2.

The light shielding film 120 is formed on an entire surface of the transparent glass substrate 110, and the resist layer 130 is formed on the entire surface of the light shielding film 120 (FIG. 2(a)).

Applicable light shielding films usually include chromium-based metal films of chromium, chromium oxide or chromium oxide nitride, but are not limited thereto.

The light shielding film 120 is formed by sputtering or vapor deposition.

The resist layer should have a desired resolution and a satisfactory processability, and is usually formed by means of spin coating.

Then, selective exposure is accomplished by an exposing unit such as an electron-beam drawing unit, and the resist is developed, thereby forming the resist image 130A opening at portions for forming slit-shaped concave grooves in the character/symbol section forming areas and at the portion for forming the shifter of the main pattern (FIG. 2(b)).

Then, the light shielding film 120 is etched at the portion exposed from the opening 135 of the resist image 130A (FIG. 2(c)), and the resist image 130A and the portion of the transparent substrate exposed from the opening of the light shielding film 120 are engraved by etching (FIG. 2(d)).

When the light shielding film is a chromium-based metal film, etching of the light shielding film 120 is accomplished through wet etching using an aqueous ceric sulfate ammonium solution or dry etching using a chlorine-based gas, by use of the resist image 130A as an etching-resistant mask.

Since forming of the shifter section and forming of the slit-shaped concave grooves 115 of the character/symbol section are simultaneously carried out, etching of the transparent glass substrate is conducted through dry etching using a fluorine-based gas.

Then, after completing etching, the resist 130A is stripped off (FIG. 2(e)), and the entire light shielding film 120 is removed through wet etching (FIG. 2(f)).

It is thus possible to simultaneously perform forming of the circuit pattern and forming of the character/symbol section.

According to the present invention, as described above, it is possible to provide a substrate having a character/symbol section permitting recognition of characters and symbols by only forming concave grooves on a transparent substrate, and a manufacturing method of such a substrate.

Particularly, when the substrate having a character/symbol section is a photomask, the characters and symbols are recognizable even when the character/symbol section is not formed by patterning of the light shielding film. It is therefore possible to increase the degree of freedom for the photomask manufacturing method, and as a result, to arrange the characters and symbols at a satisfactory operating efficiency with no problem in quality of the character/symbol section.

What is claimed is:

1. A processing method of a character/symbol section in a substrate having the character/symbol section to be recognized as a character, symbol or both in addition to a phase-shift section on a surface of the same substrate, wherein said substrate having the character/symbol section is a chromeless phase-shift mask having no substrate-engraving-type light shielding layer or a phase mask for fiber Bragg grating fabrication, and said resist arranging step is conducted by simultaneously carrying out, after providing a light shielding film over an entire surface of the transparent substrate and arranging an electron-beam-sensitive resist over said entire surface of the light shielding film, a step for forming the character/symbol section and a step for forming the shifter section, comprising (A) a resist image forming sub-step of selectively exposing the resist to electron beam, and developing the resist, thereby forming a resist image opening at portions for forming the character/symbol section and a portion for forming a shifter section;
   (B) an etching sub-step of etching a light shielding film opening at portions for forming the character/symbol section and a portion for forming the shifter section;
   (C) a substrate engraving sub-step of engraving the portions of the substrate exposed from the openings of the resist and the light shielding film by etching; and
   (D) a sub-step of removing remaining resist and light shielding film.

2. The method of claim 1, wherein the character/symbol section comprises a pattern comprising concave grooves having a slit-shaped or lattice-shaped pattern.

* * * * *